United States Patent [19]

Ishikawa et al.

[11] Patent Number: 5,284,783
[45] Date of Patent: Feb. 8, 1994

[54] METHOD OF FABRICATING A HETEROJUNCTION BIPOLAR TRANSISTOR

[75] Inventors: Hideaki Ishikawa, Hadano; Toshio Fujii, Atsugi; Eizo Miyauchi, Yokohama, all of Japan

[73] Assignee: Fujitsu Limited, Kawasaki, Japan

[21] Appl. No.: 724,935

[22] Filed: Jul. 2, 1991

Related U.S. Application Data

[63] Continuation-in-part of Ser. No. 426,042, Oct. 24, 1989, abandoned.

[30] Foreign Application Priority Data

Oct. 27, 1988 [JP]  Japan ................. 63-271345

[51] Int. Cl.$^5$ ........................................... H01L 21/265
[52] U.S. Cl. ........................................ 437/31; 437/81; 437/105; 437/107; 437/126; 437/133
[58] Field of Search ............... 437/31, 81, 105, 107, 437/126, 133

[56] References Cited

U.S. PATENT DOCUMENTS

| | | | |
|---|---|---|---|
| 4,235,651 | 11/1980 | Kamath et al. | 437/133 |
| 4,383,872 | 5/1983 | Roberts | 437/133 |
| 4,592,793 | 6/1986 | Hovel et al. | |
| 4,593,457 | 6/1986 | Birrittella | |
| 4,751,201 | 6/1988 | Nottenburg et al. | |
| 4,801,993 | 1/1989 | Ankri et al. | |
| 4,847,665 | 7/1989 | Mand | |
| 4,860,066 | 8/1989 | Kirchner et al. | |

OTHER PUBLICATIONS

K. C. Wang et al., "A 20-GHz frequency divider implemented with heterojunction bipolar transistors", *IEEE Electron Device Letters*, vol. EDL-8, No. 9, Sep. 1987, pp. 383–385.

K. Ohta et al., "Theory and experiment of heterojunction bipolar transistor at very low temperatures", *International Electron Devices Meeting Technical Digest*, Los Angeles, CA, 7th–10th Dec. 1986, pp. 89–92.

W. T. Tsang et al., "GaInAs/GaInAsP/InP heterostructure bipolar transistors with very thin base (150 Å) grown by chemical beam epitaxy", *Applied Physics Letters*, American Institute of Physics, vol. 53, No. 11, 12th Sep. 1988, pp. 983–985.

Masu et al., "Preparation of $(Al_xGa_{1-x})_yIn_{1-y}As$ ($0 \leq x \leq 0.5 = 0.47$) lattice matched to InP substrates by molecular beam epitaxy", *J. Appl. Phys.*, No. 53(11), Nov. 1982, pp. 7558–7560.

Cheng et al., "Beryllium doping in $Ga_{0.47}In_{0.53}As$ and $Al_{0.48}In_{0.52}As$ grown by molecular-beam epitaxy", *J. Appl. Phys.*, No. 52(7), Jul. 1981, pp. 4672–4675.

Kawamura et al., "Electrical and optical properties of Be-doped InP grown by molecular beam epitaxy", *J. Appl. Phys.*, No. 54(2), Feb. 1983, pp. 841–846.

Tell et al., "Beryllium implantation doping of InGaAs", *Appl. Phys. Lett.*, No. 44(4), 15 Feb. 1984, pp. 438–440.

Le Corre et al., "Influence of oxygen incorporation on beryllium-doped InGaAs grown by molecular beam epitaxy", *Appl. Phys. Lett.*, No. 51(20), 16 Nov. 1987, pp. 1597–1599.

Dildey et al., "Replacement of magnesium in InGaAs/InP heterostructures during zinc diffusion", *Appl. Phys. Lett.*, No. 55(9), 28 Aug. 1989, pp. 876–878.

Roizes et al., "Dopage beryllium de couches InGaAs elaborees par epitaxie jet moleculaire: etude de la compensation", *Revue Phys. Appl.*, No. 24, Apr. 1989, pp. 447–451.

Furukawa et al., in "4.2°K Operation of InAlAs/InGaAs Heterojunction Bipolar Transistor" in *Jap. Jr. Appl. Phys.* 25(10), 1986, pp. L862–L864.

*Primary Examiner*—Robert Kunemund
*Assistant Examiner*—Ramamohan R. Paladugu
*Attorney, Agent, or Firm*—Staas & Halsey

[57] ABSTRACT

A method of fabricating a semiconductor device having an epitaxial layer of a group III-V semiconductor material provided on an underlying crystal layer with a lattice matching therewith, the semiconductor material being doped to the p-type by addition of beryllium and selected from a group including gallium aluminum arsenide and indium gallium aluminum arsenide, in which the method comprises steps of growing the epitaxial layer on the underlying crystal layer, adding beryllium to a concentration level of about $5 \times 10^{19}$ atoms/cm$^3$ to about $5 \times 10^{20}$ atoms/cm$^3$ to the semiconductor material, and adding indium by an amount of about 0.5 mole percent to about 8 mole percent with respect to group III elements in the semiconductor material.

16 Claims, 7 Drawing Sheets

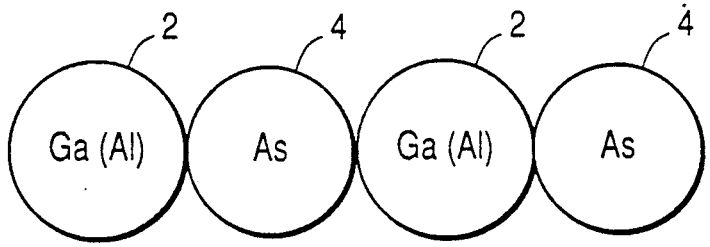
FIG. 1A
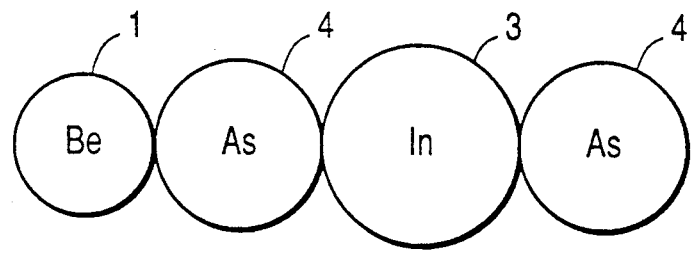
FIG. 1B
FIG. 6
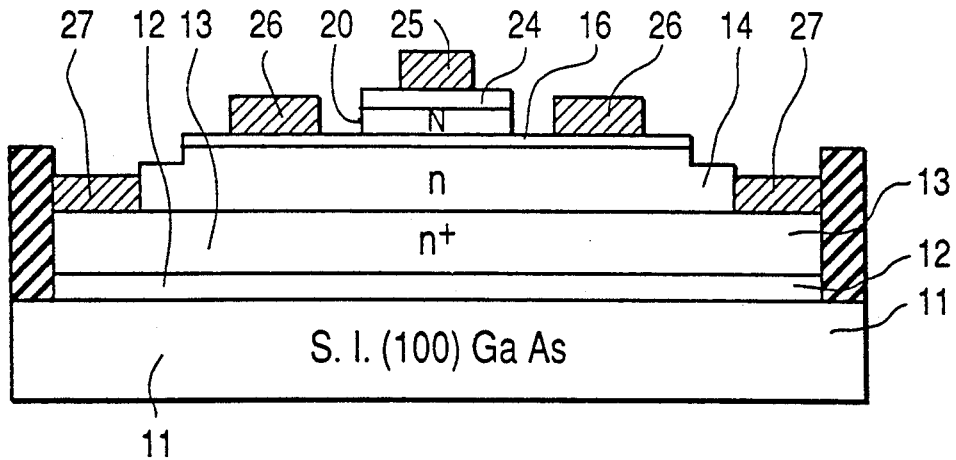

METHOD OF FABRICATING A HETEROJUNCTION BIPOLAR TRANSISTOR

CROSS-REFERENCE TO RELATED APPLICATIONS

The present application is a continuation-in-part of application Ser. No. 426,042, filed Oct. 24, 1989 now abandoned entitled METHOD OF MANUFACTURING A HETEROJUNCTION BIPOLAR TRANSISTOR.

BACKGROUND OF THE INVENTION

1. Field of the Invention

The present invention generally relates to semiconductor devices and more particularly to a method of fabricating a heterojunction bipolar transistor (HBT).

2. Description of the Related Art

HBT using a group III-V compound semiconductor material such as gallium arsenide (GaAs) is characterized by a high operational speed. This desirable operational characteristic is obtained mainly as a result of the high electron mobility in the group III-V compound forming the transistor. Further the use of a material having a large band gap for the emitter also contributes to the increase of the speed of the device.

In such an HBT, or in a bipolar transistor in general, it is desired that the base of the transistor is made as thin as possible in order to reduce the base transit time of electrons and hence to increase the operational speed of the transistor further. However, excessive reduction of the thickness of the base causes an adverse increase of the base spreading resistance that in turn decreases the speed of the transistor. Thus, in order to decrease the thickness of the base without increasing the base spreading resistance, it is desired to dope the base to a doping level as high as possible, for example to a level of about $1 \times 10^{20}$ cm$^{-3}$.

Meanwhile, it is known that the operational speed of the HBT is further improved by establishing an electric field in the base such that the electrons passing therethrough are accelerated. Such an electric field is obtained by providing a compositional gradient in the material forming the base such that there is a large band gap at a side of the base in contact with the emitter and such that the band gap is narrowed continuously toward the collector. For this purpose, gallium aluminum arsenide (GaAlAs) having a composition of $Ga_{1-x}Al_xAs$ is used for the base with a gradual change of the composition x ranging from 0 to 0.1. Note that there is substantially no change of lattice constant in the foregoing system and the problem of the lattice mismatch is avoided.

In an npn-type HBT constructed on a GaAs substrate with a base of GaAs doped to the p-type, beryllium (Be) is used as the dopant for the base. Unfortunately, it is known that the diffusion coefficient of Be in GaAs increases steeply by a factor of one thousand to even ten thousand when the concentration level of Be is increased beyond a level of about $4 \times 10^{19}$ cm$^{-3}$ (Pao, Y. C. et al. J. Appl. Phys. 60, 1986, p. 201). Further, it is known that such an increase of the diffusion coefficient of Be is further enhanced in the system of GaAlAs (Miller, D. L., J. Appl. Phys. 57, 1985, p. 1816). In other words, there is a tendency that Be is diffused into the neighboring collector and emitter during the fabrication process of the transistor, and there is a substantial risk that the conduction type of the emitter and collector is changed or the bipolar structure of the transistor is damaged. As a high temperature of about 600° C. or more is needed for the growth of GaAlAs, the problem of diffusion of Be into the neighboring collector or emitter becomes worse in the case of the HBT using GaAlAs for the graded base. Thus, the conventional HBT has a problem in that it cannot be constructed to have a sufficiently reduced base thickness as well as a graded base profile to fully exploit the high speed performance of the HBT.

A similar problem appears also when the npn-type HBT is constructed on an indium phosphide (InP) substrate with a base of indium gallium aluminum arsenide (InGaAlAs) sandwiched by a collector and an emitter of indium gallium arsenide. Thus, when Be is doped to a level exceeding about $1 \times 10^{20}$ cm$^{-3}$ in InGaAlAs, the diffusion coefficient of Be is increased significantly.

On the other hand, there is a known HBT described by Wang et al. (Wang, K. C., Asbeck, P. M., Chang, M. F., Sullivan, G. J. and Miller, D. L., IEEE Electron Device Letters, EDL-8, no.9, September 1987, pp. 383–385) in which Be is doped to the base with a high concentration level together with an indium arsenide (InAs) component contained in the base by an amount of 10 mole %. In this device, the problem of excessive diffusion of Be is avoided by choosing InGaAs that is free from aluminum (Al) for the base so that the base can be grown in a low temperature range. This device, however, does not allow the compositional gradient in the base and thus the device has a limitation in the operational speed. Formation of the compositional gradation by adding elements other than Al to the system of InGaAs is generally not possible because of the unacceptable mismatch of lattice with respect to the collector or emitter.

SUMMARY OF THE INVENTION

Accordingly, it is a general object of the present invention to provide a novel and useful method of fabricating a heterojunction bipolar transistor wherein the aforementioned problems are eliminated.

Another and more specific object of the present invention is to provide a method of fabricating a semiconductor device having an epitaxial layer of a compound semiconductor material that contains Be with a high concentration level, wherein the abnormal increase of the diffusion of Be in the epitaxial layer can be suppressed effectively.

Another object of the present invention is to provide a method of fabricating a semiconductor device having an epitaxial layer of a p-type compound semiconductor material selected from a group comprising GaAlAs and indium gallium aluminum arsenide (InGaAlAs), with a composition adjusted so as to achieve a lattice matching with an underlying crystal and doped by Be with a concentration level of $5 \times 10^{19}$–$5 \times 10^{20}$ cm$^{-3}$, wherein the epitaxial layer is further added with indium (In) with a level of 0.5–8 mole % with respect to the group III elements contained in the epitaxial layer. According to the present invention, the strain induced in the crystal structure of the group III-V compound semiconductor material by the doping of Be having a small atomic radius (1.06Å) is compensated by addition of In which has a large atomic radius (1.44Å). As a result, energetical instability of Be associated with the strain energy of the lattice deformation that in turn invites relative lowering of the energy barrier of diffusion is eliminated and the problem of the abnormal increase of the diffusion of Be is avoided. Note that Be and In are distributed at random in the crystallographic site for the group III element in the structure and the overall strain of the crystal lattice is relaxed. As a result of elimination of the abnormal diffusion of Be, the semiconductor device such as HBT can be fabricated without the risk that the semiconductor layers adjacent to the foregoing epitaxial layer are erroneously doped or the structure of the device is destroyed.

Other objects and further features of the present invention will be apparent from the following detailed description when read in conjunction with attached drawings.

BRIEF DESCRIPTION OF THE DRAWINGS

FIGS. 1(A) and (B) are schematical diagrams showing the principle of the present invention;

FIG. 6 is a cross sectional view showing a structure of an HBT fabricated according to a first embodiment of the present invention;

DESCRIPTION OF THE PREFERRED EMBODIMENTS

Figure 2A:
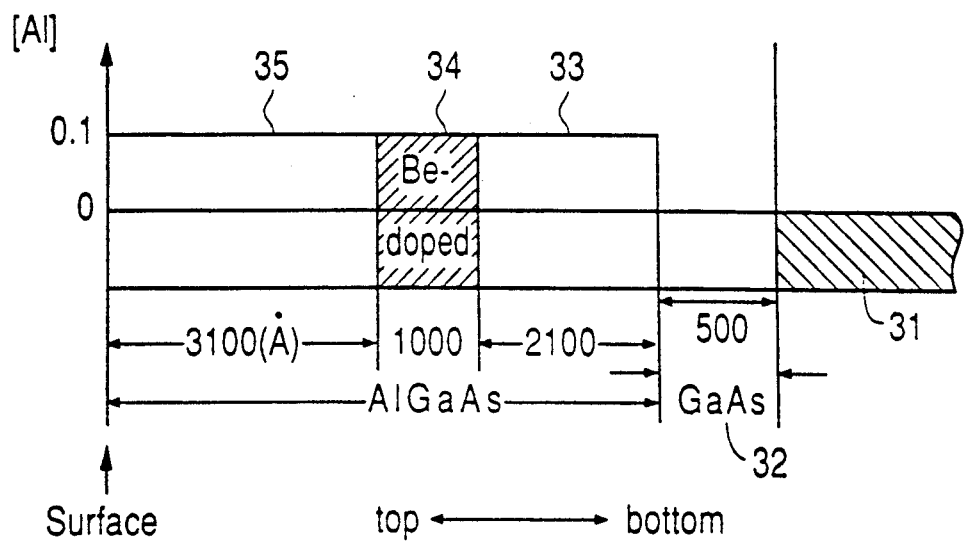
FIGS. 2(A) and (B) are diagrams showing samples used for experiments conducted to demonstrate the suppressing of the diffusion of Be by doping of In, wherein the sample of FIG. 2(A) corresponds to a prior art method and the sample of FIG. 2(B) corresponds to the present invention.

FIGS. 1(A) and (B) show the principle of the present invention. In FIG. 1(A) showing a schematical structure of GaAs, a gallium (Ga) atom 2 and an As atom 4 are assembled into a zinc blende structure having a face-centered cubic (fcc) packing in which the Ga atom 2 occupies a sublattice or site for the group III element having the tetrahedral coordination and the As atom 4 occupies a sublattice or site for the group V element also having the tetrahedral coordination. In a GaAlAs crystal, Al substitutes a part of Ga.

When a Be atom 1 is doped with a substantial concentration to the structure of FIG. 1(A), the Be atom thus doped substitutes a part of the Ga atoms 2 as shown in FIG. 1(B). Thereby, there appears a distortion or deformation in the crystal structure particularly when the concentration level of Be is increased to a range of about $5 \times 10^{19}$–$5 \times 10^{20}$ cm$^{-3}$, as the Be atom has a substantially smaller atomic radius as compared to Ga atom or Al atom.

The following Table I summarizes the atomic radius for Be and the group III as well as group V elements involved in the HBT of the present invention.

TABLE I

Atomic radius of typical qroup III and group elements as well as Be used for doping of group III-V compound

| Element | Radius |
|---|---|
| Be | 1.06 Å |
| Al | 1.26 Å |
| Ga | 1.26 Å |
| In | 1.44 Å |
| As | 1.18 Å |

In the present invention, it was found that the abnormal increase of the diffusion of Be in the compound or system of GaAlAs or InGaAlAs is suppressed significantly by introducing In with an amount of about 0.5 to 8 mole % with respect to the group III elements in the system. As a result of simultaneous addition of an In atom 3 together with the Be atom 1, the strain formed in the crystal structure is relaxed as shown in FIG. 1(B). It is believed that such a relaxation of the strain of the crystal structure causes the relative lowering of the energy of Be in the structure and the energy barrier for diffusion of Be is relatively increased as compared to the potential energy of Be. As a result of such a relative increase of the energy barrier of diffusion, the abnormal diffusion of Be into the neighboring semiconductor layers is successfully eliminated.

FIGS. 2(A) and (B) show the construction of test samples used to demonstrate the effect of eliminating the abnormal diffusion of Be by simultaneous addition of In according to the present invention in comparison with a prior art method in which no such simultaneous addition of In is made.

Referring to FIG. 2(A) showing a test sample produced according to the prior art method, a buffer layer 32 of GaAs is grown epitaxially on a (100) surface of a GaAs substrate 31 for a thickness of 500Å and an GaAlAs layer 33 having a composition of $Ga_{0.9}Al_{0.1}As$ is grown further on the buffer layer 32 for a thickness of 2100Å. On the GaAlAs layer 33, another GaAlAs layer 34 doped to the p-type and having the same composition $Ga_{0.9}Al_{0.1}As$ is grown for a thickness of 1000Å. In this test sample, the thickness of the layer 34 is set larger than the actual thickness of the base of a typical HBT in order to examine the diffusion of Be in detail. Further, another GaAlAs layer 35 having also the same composition $Ga_{0.9}Al_{0.1}As$ is grown on the layer 34. In the drawing, the ordinate represents the composition of aluminum (Al) in the layers 31–35.

Figure 2B:
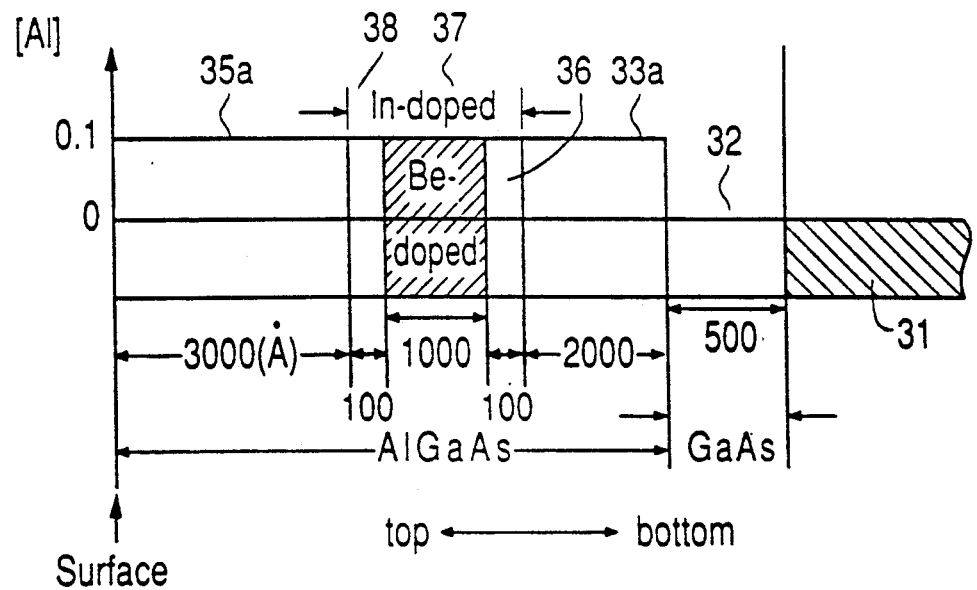

FIG. 2(B) shows the structure of a test sample corresponding to the present invention. In this drawing, these portions corresponding to the portions described with reference to FIG. 2(A) are given the identical reference numerals and the description thereof will be omitted.

In this test sample, after the epitaxial growth of the buffer layer 32 for a thickness of 500Å on the substrate 31, a GaAlAs layer 33a having a composition of $Ga_{0.9}Al_{0.1}As$ is grown on the buffer layer 32 for a thickness of 2000Å. Next, a lower boundary layer 36 having a composition of $Ga_{0.9}Al_{0.1}As$ and added with In is grown on the buffer layer 33a for a thickness of 100Å, and a p-type GaAlAs layer 37 is grown on the lower boundary layer 35 together with the addition of In and further with Be for a thickness of 1000Å. Further, an upper boundary layer 38 of GaAlAs having a composition of $Ga_{0.9}Al_{0.1}As$ and added with In is grown on the p-type layer 37 with a thickness of 100Å. Further, a still another GaAlAs layer 35a having the same composition of $Ga_{0.9}Al_{0.1}As$ is grown with a thickness of 3000Å.

The In concentration with respect to the total amount of Ga and Al is maintained the same throughout the layers 36–38. Further, a number of test samples having the structure of FIG. 2(B) are prepared with various concentration levels for In. Note that the ordinate in FIG. 2(B) represents the Al composition similarly to the case of FIG. 2(A).

In both of the test samples, the growth of the layers is made by molecular beam epitaxy (MBE) at a temperature of 600° C. with a growth rate of 1 μm/hour. During the growth, the vapor pressure of As is controlled at $4 \times 10^{-5}$ Torr, and the temperature of the cells for holding the source materials of Al and Ga is controlled such that the composition ratio of Al and Ga in the obtained semiconductor layer is maintained at 1:9. Further, the temperature of the cells for holding the source material of Be and In is controlled so as to establish a predetermined concentration level for these elements. As a result, Be alone or Be and In together are incorporated into the crystallographic site for the group III element of GaAlAs during the growth of the layer 37.

Figure 3A:
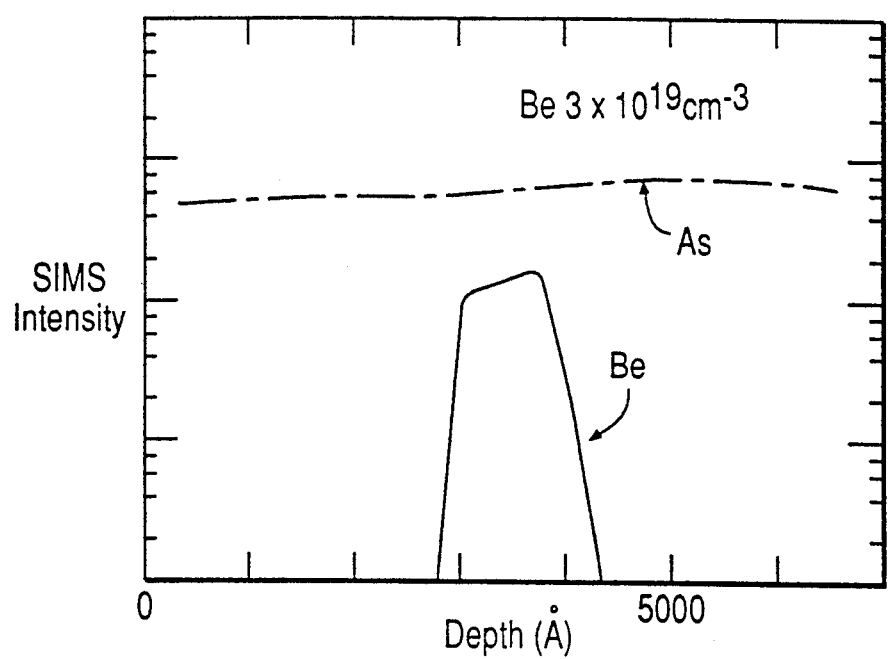
FIGS. 3(A) and (B) are diagrams showing results of the experiment using the sample of FIG. 2(A) corresponding to a prior art method.
Figure 3B:
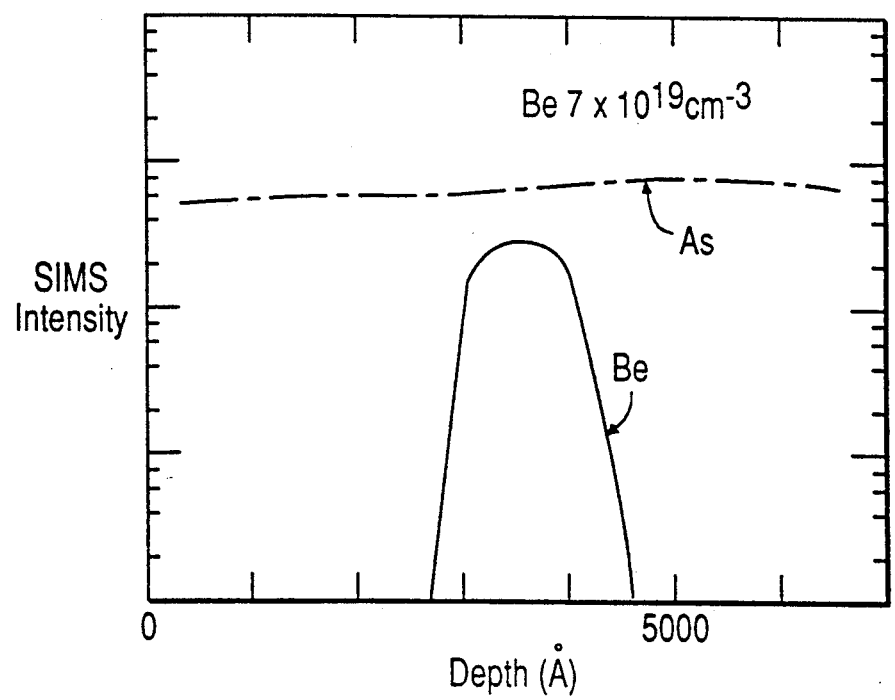

FIGS. 3(A) and (B) show the result of evaluation of the test samples of FIG. 2(A) thus formed. In this evaluation, the compositional profile of Be was measured from the top surface of the GaAlAs layer 35 to the bottom of the GaAlAs layer 33 by secondary ion mass spectroscopy (SIMS), in which FIG. 3(A) shows the case in which Be is doped to the layer 34 with a level of $3 \times 10^{19}$ cm$^{-3}$ and FIG. 3(B) shows the case in which Be is doped to the layer 34 with a level of $7 \times 10^{19}$ cm$^{-3}$. In the description hereinafter, the thickness of a region that contains Be is represented as a thickness of a layer containing Be with a concentration level that is one-tenth of the maximum concentration level of Be contained in that region.

As is clearly seen from FIG. 3(A), the region of the sample in which Be is contained is confined within a thickness of about 1200Å in correspondence to the designed layer thickness of the layer 34 when Be is doped within the level of $3 \times 10^{19}$ cm$^{-3}$. No substantial diffusion of Be beyond the base layer 34 is observed. On the other hand, when the concentration level of Be is increased to a level of $7 \times 10^{19}$ cm$^{-3}$, the thickness of the region in the sample in which Be is contained is broadened to a thickness of about 1500Å as is clearly seen in FIG. 3(B). This means that there is a substantial diffusion of Be from the base layer 34 in agreement with the aforementioned report (Pao, Y. C. et al. op.cit.).

Figure 4A:
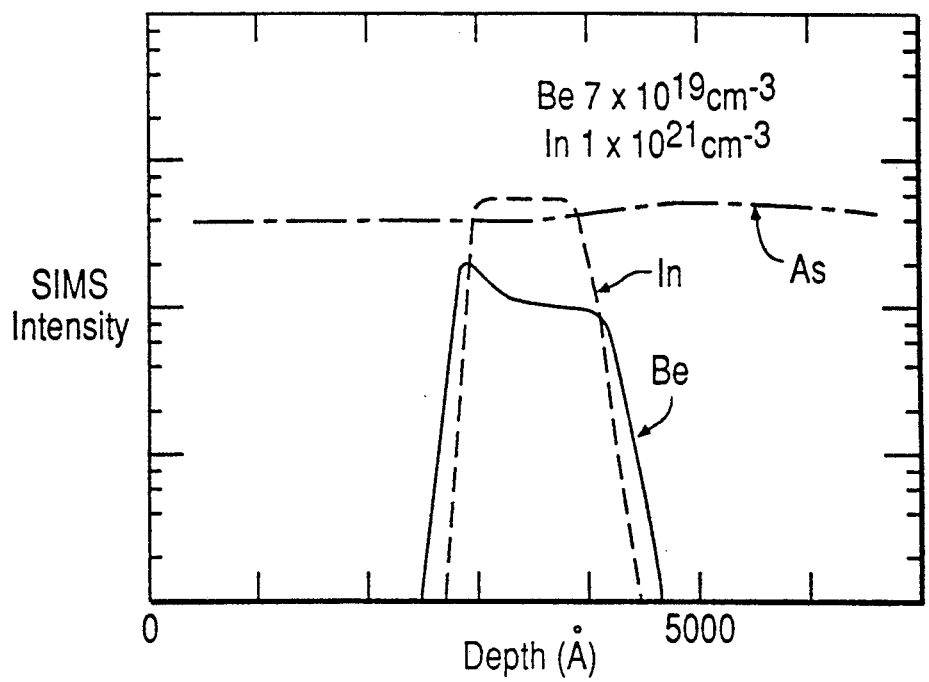
FIGS. 4(A)–(C) are diagrams showing results of the experiment using the sample of FIG. 2(B) corresponding to the present invention.

FIGS. 4(A), (B) and (C) show a result of the evaluation for the test sample of FIG. 2(B) with a constant doping level of Be at $7 \times 10^{19}$ cm$^{-3}$ and with various In concentration levels. The evaluation was made by SIMS similarly to the foregoing case.

Referring to FIG. 4(A) corresponding to the Be concentration level of $7 \times 10^{19}$ cm$^{-3}$ and the In concentration level of $1 \times 10^{21}$ cm$^{-3}$, there appears a similar broadening of the Be-containing region reaching a thickness of about 1800Å similarly to the case of FIG. 3(B). In other words, there exists a similar abnormal increase of Be diffusion in this case.

Figure 4B:
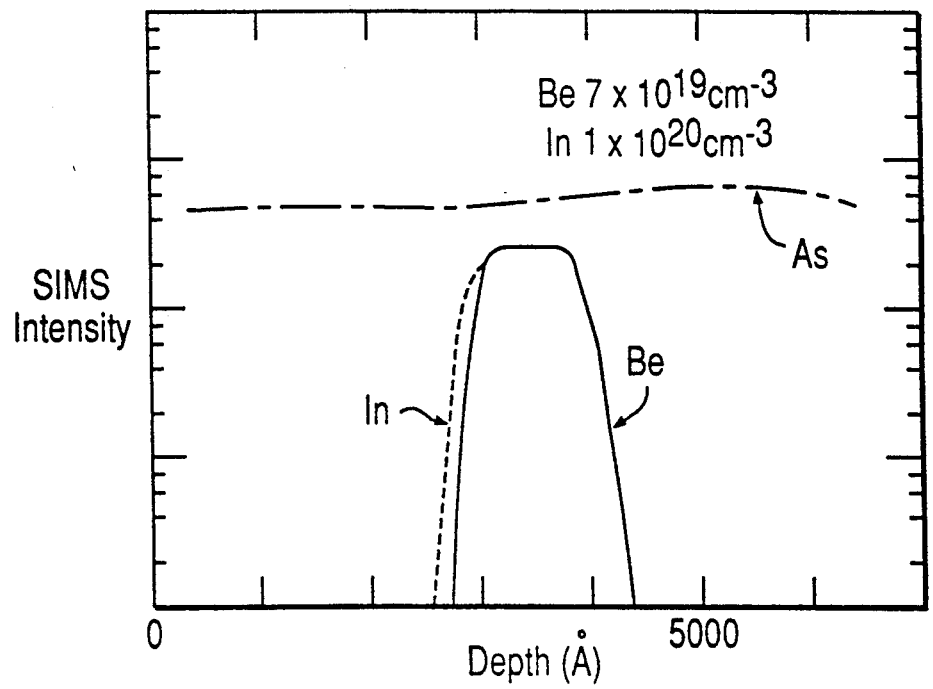

When the In concentration level is reduced to $1 \times 10^{19}$ cm$^{-3}$ (FIG. 4(B)), on the other hand, it can be seen that the thickness of the portion containing Be in the test sample is confined in the range of about 1200Å even when the layer 37 is doped with Be to the concentration level of $7 \times 10^{19}$ cm$^{-3}$. In other words, the abnormal increase of the diffusion of Be is effectively suppressed when the In content in the GaAlAs layer 37 is chosen as such.

Figure 4C:
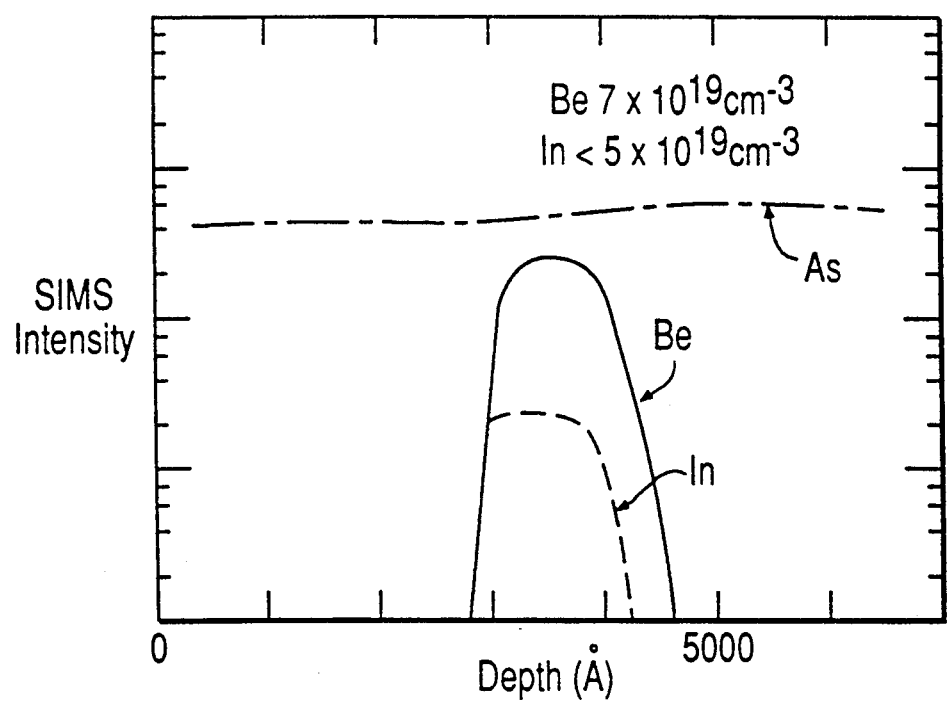

When the content or concentration level of In is further reduced to below $5 \times 10^{19}$ cm$^{-3}$ that is the detection limit of SIMS, it can be seen from FIG. 4(C) that the broadening of the Be-containing region is again increased to an extent of about 1500Å similarly to that of FIG. 3(B). In this case, it is understood that the suppression of the abnormal diffusion of Be is not effective because of the too small concentration level of In.

Note that a similar tendency is observed also in the system of GaAs, InGaAs or InGaAlAs. In general, it was found that the abnormal increase of the diffusion coefficient of Be is suppressed by adding In according to a formula of $In_y(III)_{1-y}(V)$ simultaneously to the doping of Be where (III) represents the group III elements, (V) represents the group V elements, and $y = 0$ represents the hypothetical composition in which there is no doping of Be. The composition y is determined generally proportional to the amount of Be added for the doping. By adding In as such, the ratio between two or more group III elements, which is usually determined to achieve a lattice matching with adjacent layers, is maintained. For example, In is added to $Ga_{1-z}Al_zAs$ such that the composition after the addition of In is represented as $In_y(Ga_{1-x}Al_x)_{1-y}As$. Obviously, the ratio between Al and Ga is not changed by the addition of In. When In is added to a system already including In such as $In_xGa_{1-x}As$, the composition after the addition of In is represented as $In_y(In_xGa_{1-x})_{1-y}As$. The value y is determined by the concentration level of Be to be added for doping as already described. In the case that Be is doped to the level of $5 \times 10^{19} - 5 \times 10^{20}$ cm$^{-3}$, a range of y between 0.005 to 0.08 is preferred for eliminating the unwanted abnormal increase of diffusion of Be.

Figure 5:
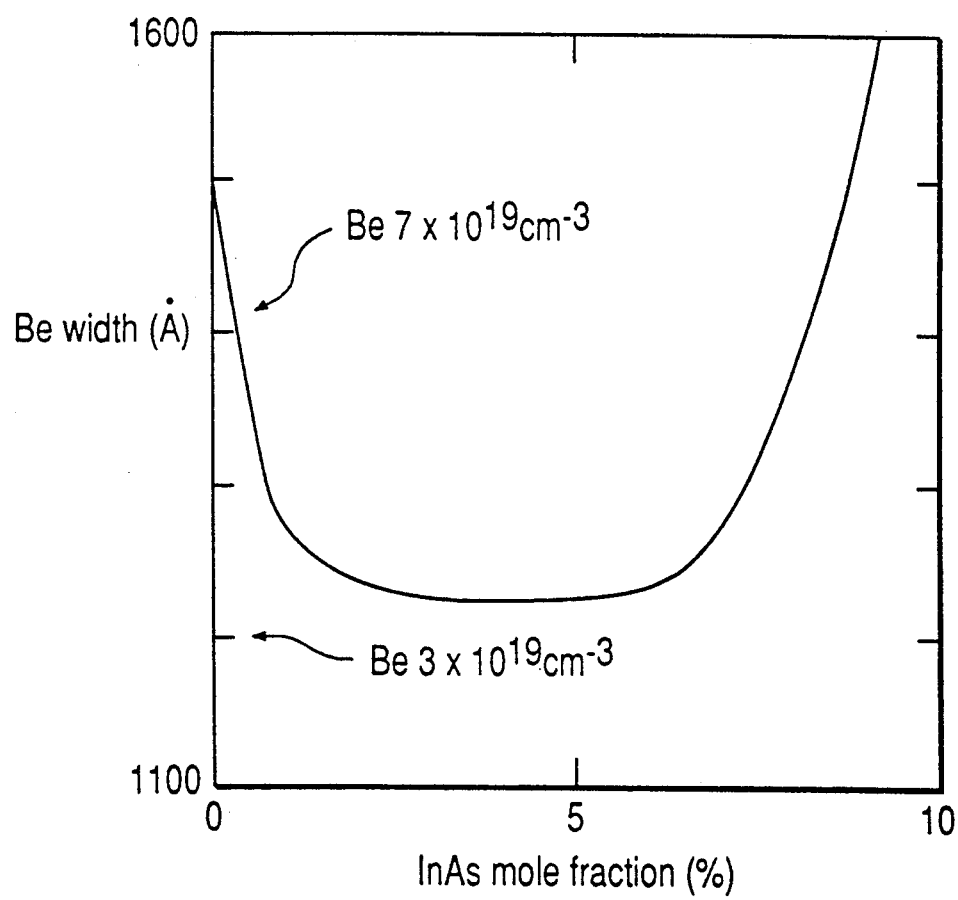
FIG. 5 is a graph showing the result of the experiment for the sample of FIG. 2(B) in correspondence to the present invention while changing the In content.

FIG. 5 shows the thickness of the Be-containing region formed in the test sample of FIG. 2(B) for various In concentration levels. Similarly to the foregoing experiments, the concentration of Be is fixed at $7 \times 10^{19}$ cm$^{-3}$. As is clearly seen in this drawing, there is a minimum in the thickness of the Be-containing region in correspondence to the compositional range of about 0.5 mole % to about 8 mole % represented in terms of the InAs component.

The foregoing results clearly indicate that the abnormal diffusion of Be is suppressed by simultaneous addition of In to the system. The reason of this is attributed to the aforementioned compensation of the strain of the crystal lattice induced by Be by the further addition of In. As a result of the relaxation of the lattice strain, it is believed that Be is stabilized energetically as compared to the energy barrier for the diffusion of Be. According to this theory, it is predicted that there holds a relation:

$$(v_{Ga} - v_{Be})N_{Be} = (v_{In} - v_{Ga})N_{In}$$

where $v_{Ga}$, $v_{Be}$, $v_{In}$ respectively stand for the atomic volume of Ga, Be and In, and $N_{Be}$ and $N_{IN}$ stand for the number of atoms of Be and In, respectively. In this case, a relation $N_{In} = 0.8 \times N_{Be}$ is predicted. In other words, it is predicted that a simultaneous doping of In with an amount that is approximately the same as that of Be is effective for the suppressing of the abnormal diffusion of Be. The results shown in FIGS. 4(A)–(C) and FIG. 5 supports this prediction. Thus, when the concentration level of In is too small as in the case of FIG. 4(C), the abnormal diffusion of Be is not suppressed effectively because of the remaining strain in the crystal lattice. On the other hand, when the concentration of In is too high as in the case of FIG. 4(A), there is induced a strain in the crystal lattice as a result of the too high concentration of In. The reason of the appearance of the optimum range of In for a given Be concentration level as shown in FIG. 5 is thus explained reasonably according to the foregoing theory. It would be obvious that the suppressing of the abnormal diffusion of Be by the simultaneous doping of In is not limited to the system of GaAlAs but is applicable also to other systems.

Figure 7:
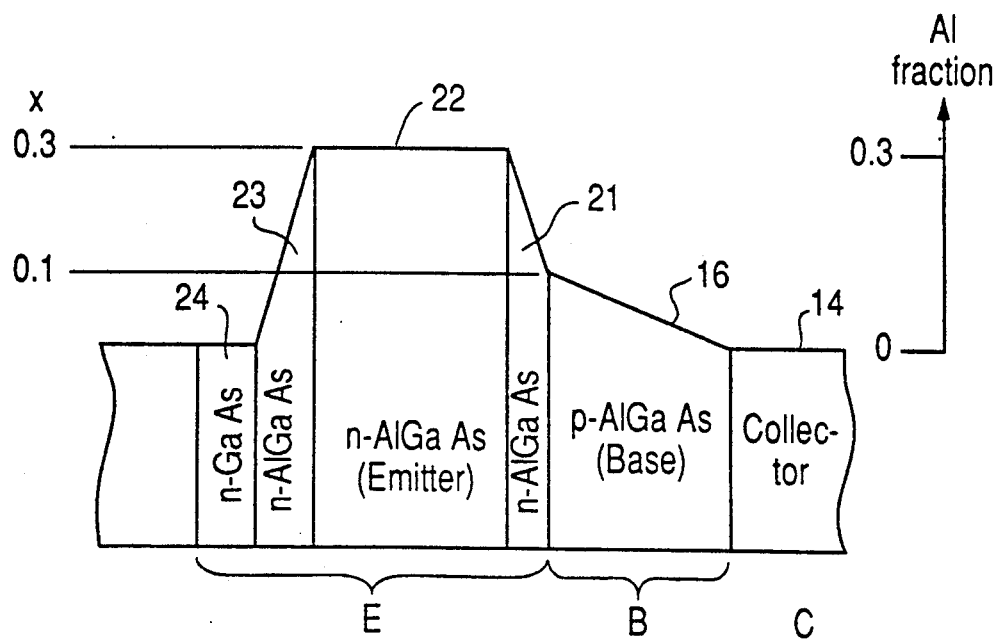
FIG. 7 is a diagram showing a compositional profile of aluminum in the device of FIG. 6.

Next, an HBT fabricated according to the present invention will be described. FIG. 6 shows a structure of an HBT according to an embodiment of the present invention. In this device, an n+-type collector buffer layer of GaAs 13 and an n-type collector 14 of GaAs are grown consecutively on a buffer layer of GaAs that in turn is grown on an (100) surface of a semi-insulating GaAs substrate 11. The collector buffer layer 13 has a thickness of 5000Å and a donor concentration level of $3 \times 10^{18}$ cm$^{-3}$ while the collector layer 14 has a thickness of 3000Å and a donor concentration level of $5 \times 10^{16}$ cm$^{-3}$. On the collector layer 14 of GaAs, a p+-type base layer 16 of InGaAlAs doped with Be and having a composition adjusted so as to maintain the lattice matching with the underlying collector layer 14, is grown epitaxially for a thickness of about 1000Å, for example, with a compositional gradient of Al as shown in FIG. 7. Be is doped typically to a concentration level of about $1 \times 10^{20}$ cm$^{-3}$. Further, an n emitter layer 20 of GaAlAs and an n+-type emitter cap layer 24 are grown epitaxially on the base layer 16 with the compositional gradient of Al as shown in FIG. 7. Note that the base layer 16 ordinarily achieves the lattice matching with the collector layer 14 when it is free from In and Be. When Be is doped to a level of $5 \times 10^{19}$–$5 \times 10^{20}$ cm$^{-3}$ in order to reduce the base spreading resistance, the lattice matching is lost because of the small atomic radius of Be incorporated into the base layer 16. In the present embodiment, the strain induced in the crystal lattice of the p+-type InGaAlAs base layer 16 by the doping of Be is successfully eliminated by the simultaneous addition of In according to the formula $In_y(Ga_{1-x}Al_x)_{1-y}As$, in which the parameter y is set to the foregoing range of 0.005–0.08 and the foregoing lattice matching is reestablished. Note that the composition x for Al is changed with respect to the composition of Ga represented as $1-x$ from a value 0.0 at an interface to the collector layer 14 to 0.1 at another interface to the emitter layer 20 independently of the composition y. Thus, there is established an electrical field that accelerates the electrons passing through the base layer 16 similarly to the case that there is no doping of In.

The n-type emitter layer 20 further comprises a first layer 21 having a thickness of about 300Å and a donor concentration level of about $5 \times 10^{17}$ cm$^{-3}$ with the aluminum composition ranging from 0.1 to 0.3, a second layer 22 having a thickness of about 900Å and the same donor concentration level with the aluminum composition of 0.3, and a third layer 23 having a thickness of about 300Å and the same donor concentration level with the aluminum composition decreasing from 0.3 to zero as illustrated in FIG. 7. As a result of the compositional gradient of Al as such, the band structure across the collector, base and emitter becomes continuous and the undesirable spike and notch in the band structure is eliminated.

The n+-type cap layer 24 has a thickness of about 1500Å and a donor concentration level of about $5 \times 10^{18}$ cm$^{-3}$. On this cap layer 24, an emitter electrode 25 is provided. Similarly, a base electrode 26 is provided on the base layer 14 and a collector electrode 27 is provided on the collector buffer layer 13.

The growth of the layers 12–24, particularly the base layer 16, is preferably made according to the MBE process already described with reference to the formation of the test sample of FIG. 2(B) or MOCVD in which a near-ideal stoichiometry is maintained in the group III-V compound semiconductor layers thus grown. The epitaxial growth of the layers 16 and 20 containing Al can be made in the temperature range of 550°–680° C., preferably above 600° C. By adding In to the base layer 16 together with Be, the diffusion of Be to the neighboring emitter layer 20 or collector layer 14 is effectively prevented even the layers 16 and 20 are grown in such a relatively high temperature range and the destruction of the HBT structure is avoided while still maintaining the graded compositional structure that facilitates the high speed operation of the device.

Figure 8:
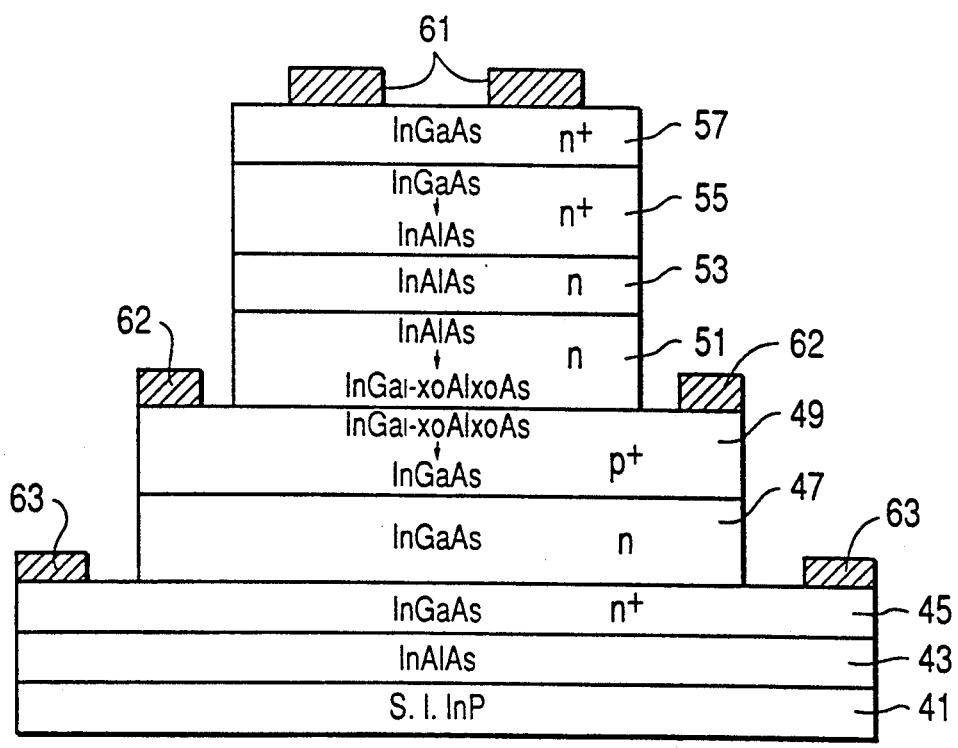
FIG. 8 is a cross sectional view showing a structure of an HBT fabricated according to a second embodiment of the present invention.

Next, a second embodiment of the HBT will be described with reference to FIG. 8. In this embodiment, the HBT is constructed on a semi-insulating InP substrate 41. Referring to FIG. 8, a buffer layer 43 of undoped InAlAs is grown epitaxially on the substrate 41 for a thickness of about 3000Å while maintaining the lattice matching with the underlying substrate 41, and an n+-type collector contact layer 45 of InGaAs with a donor concentration level of $2 \times 10^{19}$ cm$^{-3}$ is grown on the buffer layer 43 for a thickness of 5000Å. Further, an n-type collector layer 47 of InGaAs with a donor concentration level of $3 \times 10^{16}$ cm$^{-3}$ is grown epitaxially on the collector contact layer 45 for a thickness of 5000Å. The composition of the InGaAs layers 45 and 47 is adjusted to $In_{0.53}Ga_{0.47}As$ and the composition of the InAlAs buffer layer is adjusted to $In_{0.52}Al_{0.48}Al$ in order to achieve the lattice matching with the underlying InP substrate 41. On a collector structure thus formed, a base layer 49 of InGaAlAs is grown epitaxially for a thickness of about 1000Å. The base layer 49 is doped to the p-type by addition of Be to the concentration level of about $1 \times 10^{20}$ cm$^{-3}$. Note that the composition of the base layer 49 is graded such that the concentration of Al is increased gradually from 0 to 0.2 from a bottom boundary of the base layer 49 to a top boundary thereof. At the same time to the doping of the base layer 49 by Be, the concentration of In is increased from 0.53 to a level corresponding to the concentration of Be according to the foregoing relation. When the Be concentration level is set in the range of $5 \times 10^{19}$–$5 \times 10^{20}$ cm$^{-3}$, In is added according to the formula

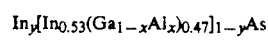

$$In_y[In_{0.53}(Ga_{1-x}Al_x)_{0.47}]_{1-y}As \qquad 25$$

with the parameter y set in the range of 0.008–0.05. As a result of the foregoing compositional grading of Al, the parameter x changes from 0 to 0.2.

On the base layer 49, a first emitter layer 51 of InGaAlAs of the n-type and having a composition of $In_{0.53}(Ga_{1-x}Al_x)_{0.47}As$ is grown with the parameter x changing from 0.2 to 1 from the bottom to the top, and a second emitter layer 53 of InAlAs doped to the n-type is grown further thereon. The first emitter layer 51 has a thickness of about 300Å and the second emitter layer 53 has a thickness of about 2000Å. In both of the first and second emitter layers 51 and 53, the concentration level of the donor is fixed at about $2 \times 10^{17}$ cm$^{-3}$.

Further, a first cap layer 55 of InGaAlAs doped to the n-type with the donor concentration level of about $2 \times 10^{19}$ cm$^{-3}$ is grown on the second emitter layer 53 for a thickness of about 700Å while changing the composition from one hundred percent InAlAs at the bottom to one hundred percent InGaAs at the top. Furthermore, a second cap layer 57 of InGaAs is grown on the first cap layer 55 for a thickness of about 500Å. The second cap layer 57 is doped to a donor concentration level of about $1 \times 10^{19}$ cm$^{-3}$. As a result of the compositional gradation for the emitter layers 51 and 53 and for the cap layers 55 and 57, the undesirable spikes and notches are eliminated from the band structure. Finally, an emitter electrode 61 of gold-germanium alloy, a base electrode 62 of gold-zinc alloy, and a collector electrode 63 of gold-germanium allow are provided respectively on the emitter cap layer 57, the base layer 49 and on the collector contact layer 45 and the HBT of this embodiment is completed.

Similarly to the foregoing embodiment, the growth of the layers 45 through 57 is made by MBE or MOCVD in the temperature range of 420°–520° C., preferably at about 460° C. Because of the simultaneous doping of Be and In to the base layer 49, the diffusion of Be to the adjacent layers is successfully suppressed in spite of the high temperature employed for the growth of the base layer. Thus, an extremely high speed HBT having the operational speed enhanced by the use of thin but low resistance base layer as well as by the use of the graded compositional profile for the base and the emitter is obtained. Associated with the suppressing of the abnormal diffusion of Be, the reproducibility of the obtained HBT is improved.

Further, the present invention is not limited to these embodiments but various variations and modifications may be made without departing from the scope of the invention.

What is claimed is:

1. A method of fabricating a semiconductor device comprising an epitaxial layer of a group III–V semiconductor material provided on an underlying crystal layer with a lattice matching therewith, said semiconductor material being doped to the p-type by addition of beryllium and selected from a group consisting of gallium aluminum arsenide and indium gallium aluminum arsenide, said method comprising the steps of:
    growing said epitaxial layer on the underlying crystal layer;
    adding beryllium to a concentration level of about $5 \times 10^{19}$ atoms/cm$^3$ to about $5 \times 10^{20}$ atoms/cm$^3$ to the semiconductor material; and
    adding indium by an amount of about 0.5 mole percent to about 8 mole percent with respect to group III elements in said semiconductor material.

2. A method as claimed in claim 1 in which said step of adding beryllium and said step of adding indium are carried out during said step of growing the epitaxial layer.

3. A method as claimed in claim 2 in which said step of adding beryllium and said step of adding indium are carried out simultaneously.

4. A method as claimed in claim 1 in which said underlying crystal layer consists of gallium arsenide, and said step of growing the epitaxial layer is made at a temperature between 550° C. and 680° C.

5. A method as claimed in claim 4 in which said step of growing the epitaxial layer is made at a temperature equal to about 600° C.

6. A method as claimed in claim 1 in which said epitaxial layer consists of indium gallium aluminum arsenide, and said step of growing the epitaxial layer is made at a temperature between 420° C. and 520° C.

7. A method as claimed in claim 6 in which said step of growing the epitaxial layer is made at a temperature of about 460° C.

8. A method of fabricating a bipolar transistor, comprising steps of:
    growing an n-type collector layer on an underlying crystal layer epitaxially;
    growing a base layer of a group III–V compound semiconductor material selected from a group of materials consisting of gallium aluminum arsenide and indium gallium aluminum arsenide on the n-type collector layer epitaxially;
    doping the base layer to the p-type by adding beryllium to the base layer with a concentration level of about $5 \times 10^{19}$ atoms/cm$^3$ to about $5 \times 10^{20}$ atoms/cm$^3$;
    adding indium to the base layer by an amount of about 0.5 mole percent to about 8 mole percent with respect to group III elements contained in the base layer; and
    growing an n-type emitter layer on said base layer.

9. A method as claimed in claim 8 in which said step of doping and said step of adding indium are carried out during said step of growing the base layer.

10. A method as claimed in claim 9 in which said step of doping and said step of adding indium are carried out simultaneously.

11. A method as claimed in claim 8 in which said base layer comprises gallium aluminum arsenide, and said growth of the base layer is made at a temperature in a range of about 550° C. to about 680° C.

12. A method as claimed in claim 11 in which said growth of the base layer is made at a temperature of about 600° C.

13. A method as claimed in claim 8 in which said base layer comprises indium gallium aluminum arsenide, and said growth of the base layer is made at a temperature in a range of about 420° C. to about 520° C.

14. A method as claimed in claim 8 in which said step of growing the base layer further comprises a step of providing a gradation of aluminum content in the base layer such that the aluminum content is increased continuously from a first side of the base layer in contact with the collector layer to a second side of the base layer in contact with the emitter layer.

15. A method as claimed in claim 8 in which said step of growing the emitter layer further comprises a step of providing a compositional gradation of aluminum content in the emitter layer such that the aluminum content increases continuously, remains constant, and then decreases continuously from a first side of the emitter layer in contact with the base layer to a second side opposite from said first side.

16. A method of fabricating a semiconductor device comprising an epitaxial layer of a group III–V semiconductor material provided on an underlying crystal layer with a lattice matching therewith, said semiconductor material being doped to the p-type by addition of beryllium and selected from a group comprising gallium aluminum arsenide and indium gallium aluminum arsenide, comprising steps of:
    growing said epitaxial layer on the underlying crystal layer;
    adding beryllium to a predetermined concentration level; and
    adding indium by an amount generally equal to that of beryllium.

* * * * *

UNITED STATES PATENT AND TRADEMARK OFFICE
CERTIFICATE OF CORRECTION

PATENT NO. : 5,284,783
DATED : Feb. 8, 1994
INVENTOR(S) : ISHIKAWA et al.

It is certified that error appears in the above-indentified patent and that said Letters Patent is hereby corrected as shown below:

Col. 6, lines 24-25, change "$Ga_{1-z}Al_xAs$" to --$Ga_{1-x}Al_xAs$--.

Col. 7, line 23, begin a new paragraph with the words "On the collector ..."; line 31, change "n emitter" to --n-type emitter--.

Col. 9, line 16, change "allay" to --alloy--; line 18, change "allow" to --alloy--.

Signed and Sealed this

Twenty-seventh Day of September, 1994

Attest:

BRUCE LEHMAN

Attesting Officer     Commissioner of Patents and Trademarks